(12) United States Patent
Gibson et al.

(10) Patent No.: US 10,122,094 B1
(45) Date of Patent: Nov. 6, 2018

(54) WIRE TERMINATING POST AND ELECTRICAL DEVICE INCLUDING SAME

(71) Applicant: EATON CORPORATION, Cleveland, OH (US)

(72) Inventors: Jeffrey Gibson, Hookstown, PA (US); Lance Gula, Clinton, PA (US)

(73) Assignee: EATON INTELLIGENT POWER LIMITED, Dublin 4 (IE)

( * ) Notice: Subject to any disclaimer, the term of this patent is extended or adjusted under 35 U.S.C. 154(b) by 0 days.

(21) Appl. No.: 15/677,268

(22) Filed: Aug. 15, 2017

(51) Int. Cl.
*H01R 4/00* (2006.01)
*H01R 4/14* (2006.01)
*H01R 11/11* (2006.01)
*H01R 4/26* (2006.01)
*H01B 7/02* (2006.01)
*H01B 7/04* (2006.01)
*H01B 13/00* (2006.01)

(52) U.S. Cl.
CPC ............ *H01R 4/14* (2013.01); *H01R 4/26* (2013.01); *H01R 11/11* (2013.01); *H01B 7/02* (2013.01); *H01B 7/04* (2013.01); *H01B 13/0036* (2013.01)

(58) Field of Classification Search
CPC ... H01R 4/02; H01R 4/14; H01R 4/26; H01R 11/03; H01R 11/11; H01B 7/02; H01B 7/04; H01B 13/0036
USPC .......... 174/74 R, 84 R, 84 C, 88 R; 403/201; 439/290, 291, 842, 843, 845, 884
See application file for complete search history.

(56) References Cited

U.S. PATENT DOCUMENTS

| | | | | |
|---|---|---|---|---|
| 1,449,727 A * | 3/1923 | Bowman | .................. | B60M 5/00 174/94 R |
| 2,938,069 A * | 5/1960 | Toedtman | .............. | H01R 4/186 174/71 R |
| 3,288,915 A * | 11/1966 | Hatfield | .................... | H01R 4/14 174/94 R |
| 3,340,352 A * | 9/1967 | Teagno | .................. | H01R 4/186 174/71 R |
| 3,354,517 A * | 11/1967 | Levinsky | ................ | F16G 11/02 174/71 R |
| 5,036,164 A * | 7/1991 | Schrader | ................ | H01R 4/186 174/94 R |
| 5,103,068 A * | 4/1992 | Schrader | ................ | H01R 4/186 174/71 R |
| 5,200,576 A * | 4/1993 | Schrader | ................ | H01R 4/186 174/71 R |
| 5,911,605 A * | 6/1999 | Wooldridge | ........... | H01R 13/28 439/790 |
| 8,389,859 B2 * | 3/2013 | Huang | .................. | H01R 4/027 174/84 C |

* cited by examiner

*Primary Examiner* — William H Mayo, III
(74) *Attorney, Agent, or Firm* — Eckert Seamans

(57) ABSTRACT

A wire terminating post formed from a conductive material includes a first end structured to interlock with a portion of an electrical component and a second end disposed opposite the first end. The second end includes a first aperture defined therethrough, the first aperture having a first diameter, and a second aperture defined therethrough, the second aperture have a second diameter less than the first diameter.

18 Claims, 4 Drawing Sheets

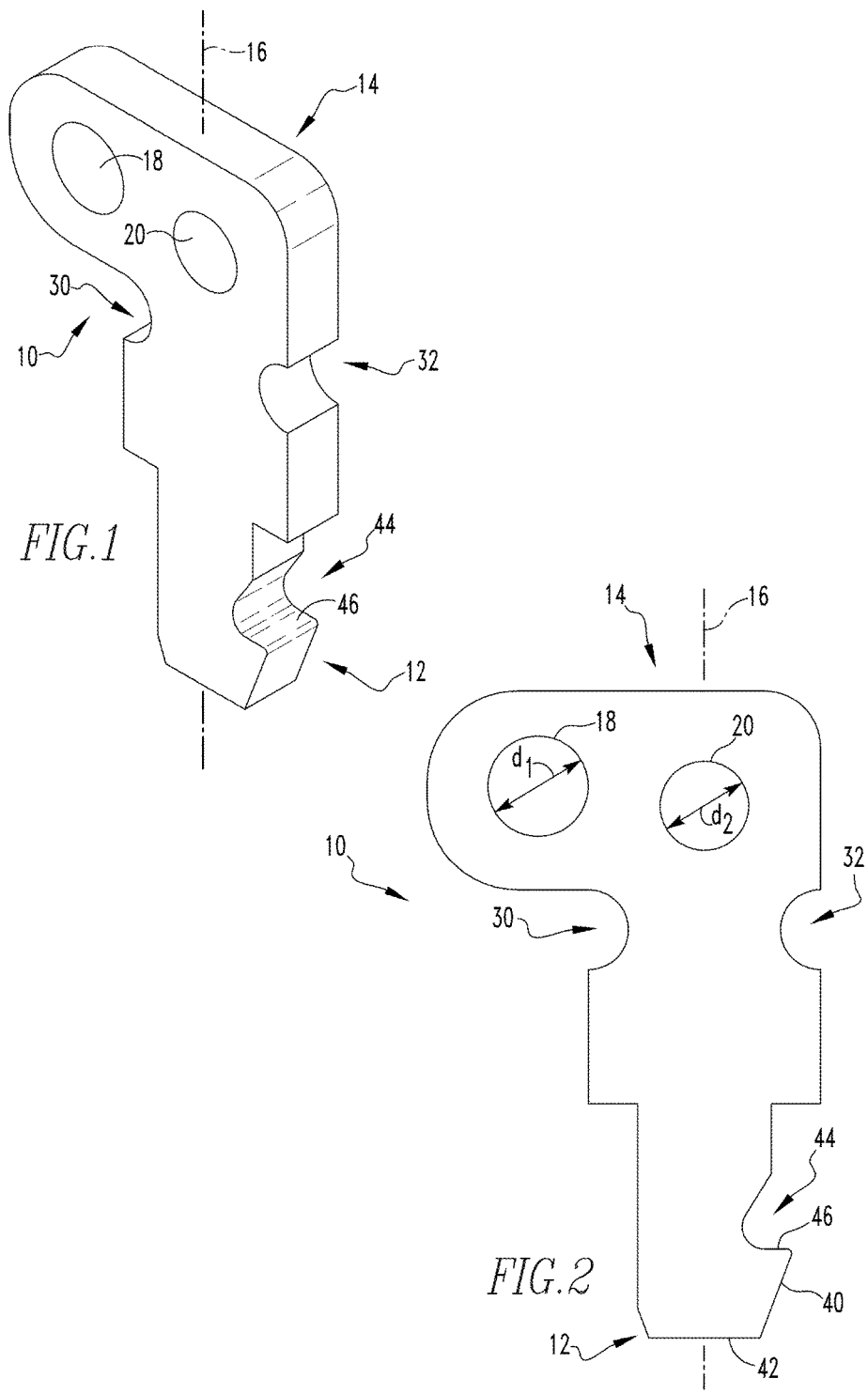

WIRE TERMINATING POST AND ELECTRICAL DEVICE INCLUDING SAME

BACKGROUND

Field

The disclosed concept relates generally to wire terminating devices and, more particularly, to electric wire terminating posts for electrically connecting wires of different gauges. The disclosed concept also relates to wiring arrangements having a wire terminating post. The disclosed concept further relates to electrical devices having a wire terminating post as well as methods of wiring a wire terminating post.

Background Information

Many devices manufactured contain electronic components consisting of small wired conductors, (i.e., solenoids, current sensors, etc.). The small wires are typically joined to larger gauge wires for remote connection to electronic components. Oftentimes, the transition from the smaller gauge wires to the larger gauge wires is problematic as it does not adequately isolate the fragile wires during handling and assembly loads. If any of the small wires are damaged, the end result is typically an unusable, most often expensive, component that cannot be repaired.

There is, therefore, room for improvement in electrical device for coupling small gauge wires to larger gauge wires.

SUMMARY

These needs and others are met by embodiments of the disclosed concept, which as one aspect is directed to a wire terminating post formed from a conductive material. The post comprises: a first end structured to interlock with a portion of an electrical component; and a second end disposed opposite the first end. The second end comprises: a first aperture defined therethrough, the first aperture having a first diameter, and a second aperture defined therethrough, the second aperture have a second diameter less than the first diameter.

The wire terminating post may further comprise: a longitudinal axis extending between the first end and the second end; a first inward extending notch portion disposed between the first end and the second end; and a second inward extending notch portion disposed generally opposite the first inward extending notch portion about the longitudinal axis between the first end and the second end.

The first inward extending notch portion and the second inward extending notch portion may be of generally semi-circular shape.

The wire terminating post may further comprise a longitudinal axis extending between the first end and the second end, wherein the first aperture is disposed further from the longitudinal axis than the second aperture.

The wire terminating post may further comprise a longitudinal axis extending between the first end and the second end, wherein the first end includes a structure which provides for the wire terminating post to be readily insertable into a portion of an electrical component but then generally locked thereto, once inserted.

The structure may comprise: an angled portion which extends from a leading edge of the first end toward the second end and away from the longitudinal axis; and a locking notch having a locking portion which is disposed adjacent the angled portion and extends inward toward, and is oriented generally perpendicular to, the longitudinal axis, wherein the locking portion is structured to engage a corresponding portion of the electrical component in a manner which resists removal of the terminating post from the electrical component when the wire terminating post is engaged with the electrical component.

As another aspect of the disclosed concept, a wiring arrangement is provided. The wiring arrangement comprises a wire terminating post as described herein; and a first wire comprising: a first portion disposed in, without being coupled to, the first aperture, and a second portion disposed in, and coupled to, the second aperture.

The first wire may comprise a conductive core surrounded by an insulating jacket, wherein the conductive core in the first portion of the first wire is spaced from the periphery of the first aperture by the insulating jacket, and wherein the conductive core in the second portion of the first wire is electrically connected to the periphery of the second aperture.

The conductive core in the second portion of the first wire may be coupled to the periphery of the second aperture by a solder material.

The wire terminating post may further comprise: a longitudinal axis extending between the first end and the second end; a first inward extending notch portion disposed between the first end and the second end; a second inward extending notch portion disposed generally opposite the first inward extending notch portion about the longitudinal axis between the first end and the second end; and a second wire wound around the wire terminating post between the first end and the second end, the second wire having at least a first portion disposed in the first inward extending notch portion and a second portion disposed in the second inward extending notch portion.

The second wire may be wound around the wire terminating post at least one complete revolution such that the second wire further includes a third portion also disposed in one of the first inward extending notch or the second inward extending notch.

The first wire may have a first gauge, the second wire may have a second gauge, and the second gauge may be greater than the first gauge.

As another aspect of the disclosed concept, an electrical device is provided. The electrical device comprises: a wiring arrangement as described herein; and an electrical component electrically connected to the second wire.

The electrical component may comprise one of a current sensor or a solenoid.

As another aspect of the disclosed concept a method of forming the wiring arrangement described herein is provided. The method may comprise: passing the first wire in a first direction through the first aperture; positioning the first wire in the second aperture by moving the first wire in a second direction opposite the first direction; and coupling the first wire to the periphery of the second aperture. Alternately, the method may comprise: positioning the first wire in the second aperture by moving the first wire in a second direction; coupling the first wire to the periphery of the second aperture; and passing the first wire through the first aperture.

Coupling the first wire to the periphery of the second aperture may comprise soldering the first wire to the periphery of the second aperture.

BRIEF DESCRIPTION OF THE DRAWINGS

A full understanding of the disclosed concept can be gained from the following description of the preferred embodiments when read in conjunction with the accompanying drawings in which:

FIG. 1 is an isometric view of a wire terminating post in accordance with a non-limiting example embodiment of the disclosed concept;

FIG. 2 is an elevational front view of the wire terminating post of FIG. 1;

DESCRIPTION OF THE PREFERRED EMBODIMENTS

Figure 3:
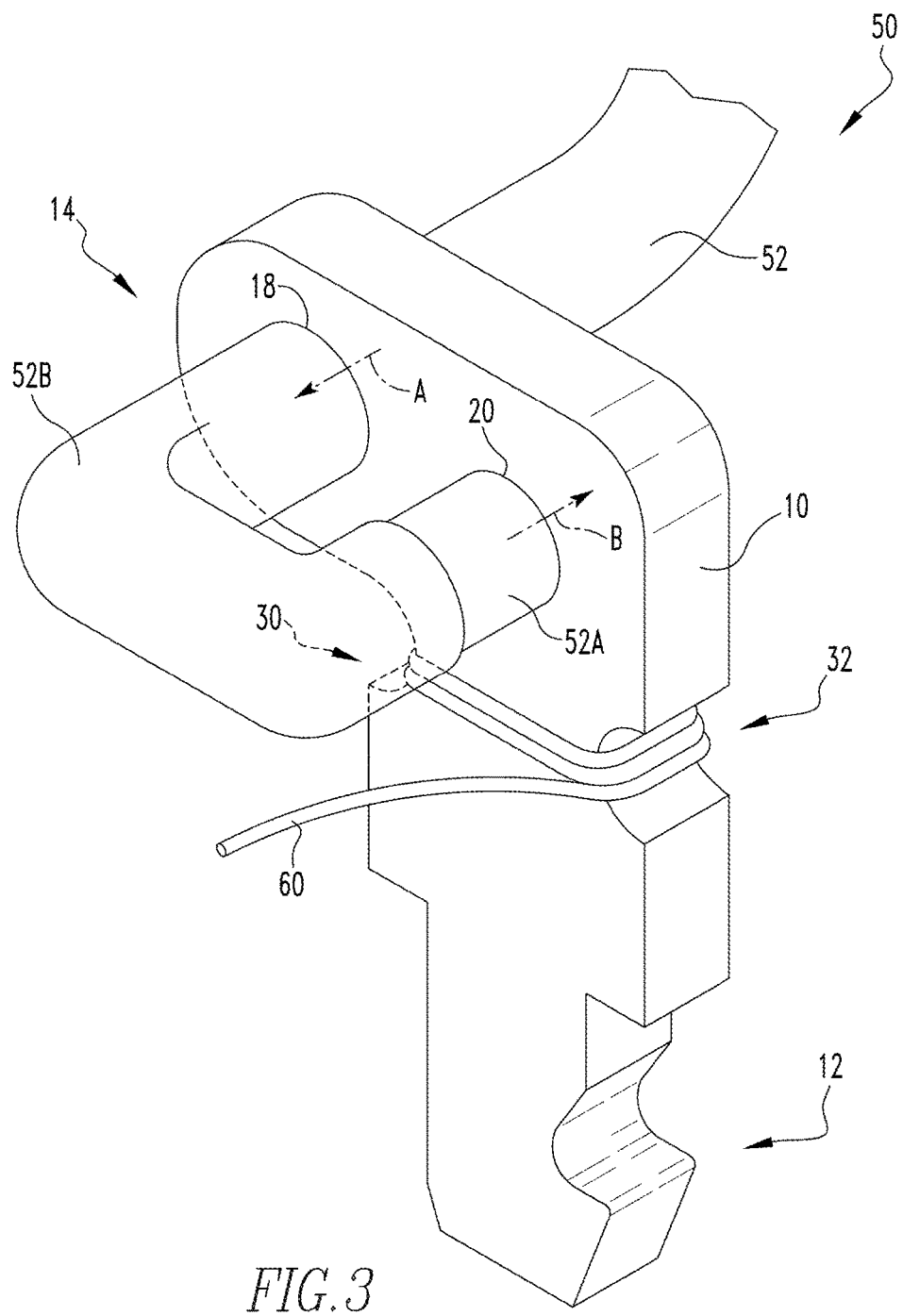
FIG. 3 is another isometric view of the wire terminating post of FIG. 1 showing a first wire conductor and a second wire conductor installed thereon and coupled thereto in accordance with a non-limiting example embodiment of the disclosed concept.

Directional phrases used herein, such as, for example, left, right, front, back, top, bottom and derivatives thereof, relate to the orientation of the elements shown in the drawings and are not limiting upon the claims unless expressly recited therein.

As employed herein, the term "accessory" refers to any known or suitable component or feature of an electrical switching apparatus having a number of electrical conductors (e.g., without limitation, wires) and expressly includes, but is not limited to, trip actuators, auxiliary switches, shunt trip devices, under voltage release devices, bell alarms.

As employed herein, the term "fastener" shall mean a separate element or elements which is/are employed to connect or tighten two or more components together, and expressly includes, without limitation, rivets, pins, screws, bolts and the combinations of bolts and nuts (e.g., without limitation, lock nuts) and bolts, washers and nuts.

As employed herein, the statement that two or more parts are "coupled" together shall mean that the parts are joined together either directly or joined through one or more intermediate parts.

As employed herein, the term "number" shall mean one or an integer greater than one (i.e., a plurality).

FIGS. 1 and 2 are, respectively, isometric and elevational front views of a wire terminating post 10 in accordance with a non-limiting example embodiment of the disclosed concept. In the example embodiment, wire terminating post 10 is generally planar in shape and formed from a suitable conductive material (e.g., without limitation, brass). Wire terminating post 10 includes a first end 12 which is structured to interlock with a portion of an electrical component (discussed in further detail below). Wire terminating post 10 further includes a second end 14 disposed opposite first end 12 such that a longitudinal axis 16 extends generally between first end 12 and second end 14. Second end 14 includes a first aperture 18 defined therethrough and a second aperture 20 defined therethrough. First aperture 18 has a first diameter $d_1$ and second aperture 20 has a second diameter $d_2$ which is less than the first diameter $d_1$.

Wire terminating post 10 further includes a first inward extending notched portion 30 and a second inward extending notched portion 32 disposed generally opposite of each other about longitudinal axis 16 between first and 12 and second and 14. In the example embodiment shown in FIGS. 1 and 2, each of notched portions 30 and 32 are formed as generally semicircular shaped concave regions. The functionality of notched portions 30 and 32 is discussed further below.

Continuing to refer to FIGS. 1 and 2, as previously noted, first end 12 of wire terminating post 10 is structured to interlock with a portion of an electrical component. More particularly, first end 12 of wire terminating post 10 includes a structure which allows for wire terminating post 10 to generally be readily insertable into a portion of an electrical component but then generally locked thereto (i.e., in a manner which resists withdrawal) once inserted. In order to provide for such functionality first end 12 includes an angled portion 40 which extends from a leading-edge 42 of first end 12 toward second end 14 and generally away from longitudinal axis 16, is best shown in FIG. 2. First end 12 further includes a locking notch 44 having a locking portion 46 which is disposed adjacent angled portion 40 and extends inward toward, and is oriented generally perpendicular to, longitudinal axis 16. Locking portion 46 is structured to engage a corresponding portion of an electrical component in a manner which resists removal of terminating post 10 from the electrical component when wire terminating post 10 is engaged with the electrical component.

Having thus described the basic arrangement of an example wire terminating post 10 in accordance with an embodiment of the disclosed concept, an example of how such wire terminating post 10 is used in a wiring arrangement 50 in accordance with an embodiment of the disclosed concept will now be described in conjunction with FIG. 3. Wiring arrangement 50 includes a wire terminating post 10, as previously discussed, having a first wire 52 secured to second end 14 thereof. First wire 52 is utilized for carrying a current a distance between remotely located electronic components and as such is a relatively heavy first gauge. In an example embodiment, 24 AWG wire has been employed, although other sizes may be employed without varying from the scope of the disclosed concept.

Such securement of first wire 52 to second end 14 of wire terminating post 10 may be accomplished in different ways. In one example embodiment of the disclosed concept, first wire 52 is secured to second end 14 by first passing wire 52 in a first direction, as shown by arrow "A", through first aperture 18 such that a first portion (not numbered) of first wire 52 is disposed in, without being coupled to, first aperture 18. Next, first wire 52 is positioned in second aperture 20 by moving first wire 52 in a second direction, opposite the first direction A, as shown by arrow "B", such that a second portion (not numbered) of first wire 52 is disposed in, second aperture 20. First wire 52 is then coupled to the periphery (not numbered) of second aperture 20. Such coupling of first wire 52 to the periphery of second aperture 20 may be carried out via soldering or other suitable operation.

In another example embodiment of the disclosed concept, first wire 52 is secured to second end 14 by first positioning first wire 52 in second aperture 20 by moving first wire 52 in the aforementioned second direction B, such that a second portion (not numbered) of first wire 52 is disposed in, second aperture 20. First wire 52 is then coupled to the periphery (not numbered) of second aperture 20. Such coupling of first wire 52 to the periphery of second aperture 20 may be carried out via soldering or other suitable operation. Next, wire 52 is passed through first aperture 18 in a direction opposite to that of the aforementioned first direction A such that a first portion (not numbered) of first wire 52 is disposed in, without being coupled to, first aperture 18.

First wire 52 comprises a conductive core 52A surrounded by an insulating jacket 52B. The first portion (i.e., the portion disposed in first aperture 18) of first wire 52 is spaced from the periphery of first aperture 18 by insulating jacket 52B. Meanwhile, conductive core 52A in the second portion (i.e., the portion disposed in second aperture 20) of first wire 52 is electrically connected to the periphery of second aperture 20 (e.g., without limitation, via a solder material). It is to be appreciated that such arrangement of first wire 52 provides for a robust connection, both electrical and mechanical, between first wire 52 and wire terminating post 10 that is resistant to mechanical loads and stresses which may be commonly encountered by first wire 52 during installation and subsequent use.

Continuing to refer to FIG. 3, wiring arrangement 50 further includes a second wire 60 which is used to electrically connect an electrical component (e.g., without limitation, a current sensor, solenoid, or other suitable electrical component) to wire terminating post 10. Second wire 60 is wound around wire terminating post 10 between first end 12 and second end 14 and then secured thereto via soldering or other suitable process. Typically, second wire 60 is would around a few times. Heat of soldering typically removes a thin enamel insulation provided on second wire 60. Second wire 60 is of a second gauge, greater than first gauge. In an example embodiment, 33 AWG wire has been utilized, although other sizes may be employed without varying from the scope of the disclosed concept. At least a first portion (not numbered) of second wire 60 is disposed in notch portion 30 and at least second portion (not numbered) of second wire 60 is disposed in notch portion 32. In an example embodiment of the disclosed concept second wire 60 is wound around wire terminating post 10 at least one complete revolution such that at least a third portion (not numbered) of second wire 60 is also disposed in one of notch portions 30 or 32. In an example embodiment of the disclosed concept, wire terminating post 10 is first inserted into a component (discussed further below) before the wrap and solder of the fragile second wire 60. This assures appropriate lead length and is less likely to damage the wire. The posts may or may not already have the first wire 52 attached.

Figure 4:
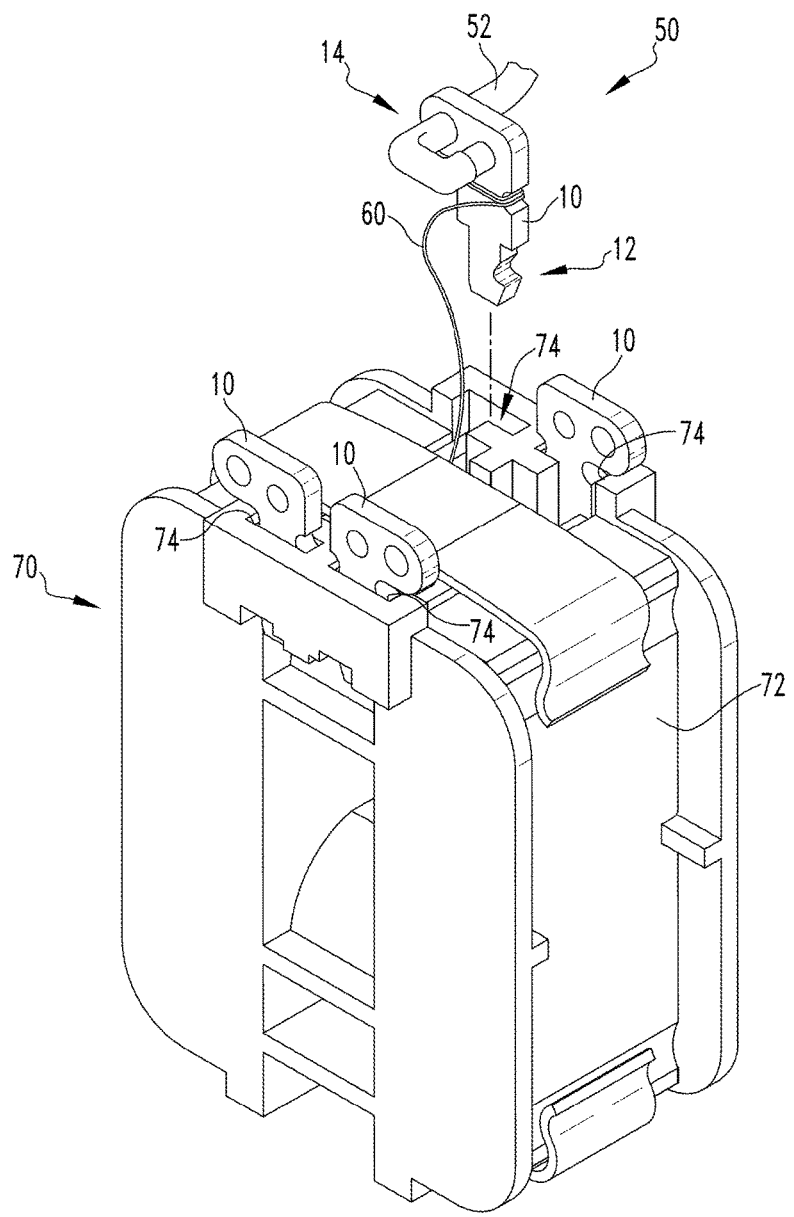
FIG. 4 is a partially exploded view of an electrical device including four wire terminating posts in accordance with a non-limiting example embodiment of the disclosed concept with one of the wire terminating posts exploded from the electrical device.
Figure 5:
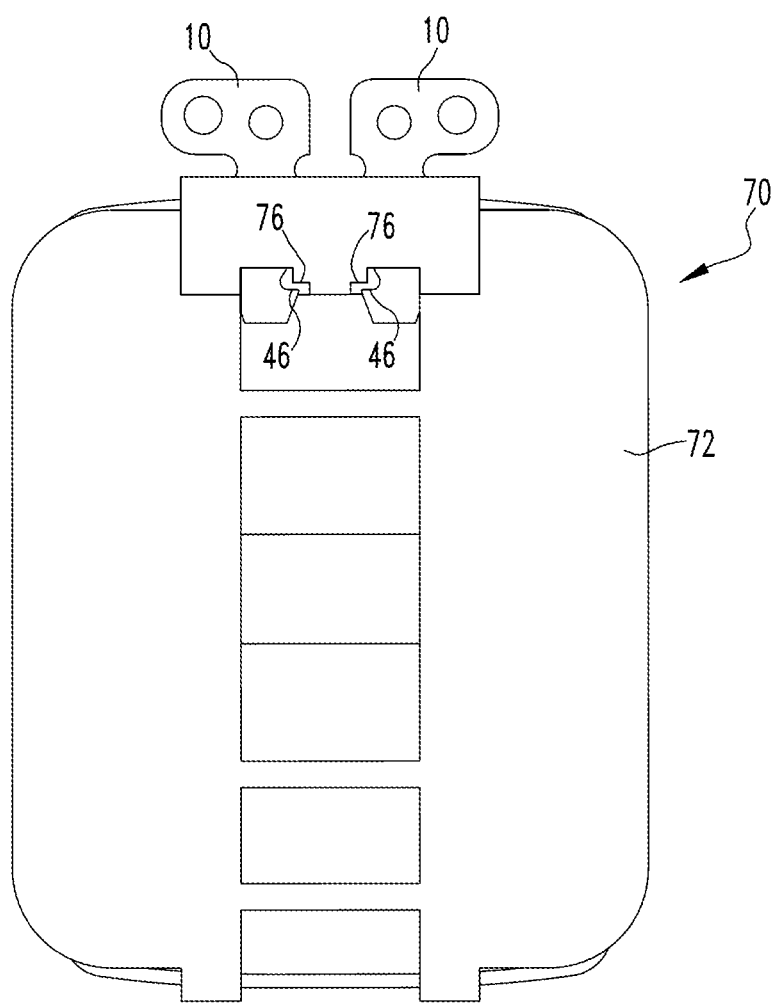
FIG. 5 is an elevational front view of the electrical device of FIG. 4.

Referring now to FIGS. 4 and 5, an example electrical device 70 is shown which utilizes a number (four are shown) of wire terminating posts 10 such as previously discussed, with one shown as part of a wiring arrangement 50 as previously discussed. Wiring device 70 includes an electrical component (not numbered) housed in a plastic bobbin 72. The electrical component may be any suitable electrical component (e.g., without limitation, a current sensor, a solenoid, etc.) having a number of conductors, such as the second wire 60 shown in FIG. 4, electrically coupled thereto and extending therefrom. Each second wire 60 is electrically connected to first end 12 of a respective wire terminating post 10, which also has a corresponding first wire 52 coupled to the second end 14 thereof.

As shown in FIG. 4, each wire terminating post 10 is disposed in a cooperating slot 74. Once fully disposed in a slot 74, each wire terminating post 10 is generally locked in place and inhibited from withdrawal therefrom by the interaction of locking portion 46 of the wire terminating post 10 and lock portion 76 of wiring device 70, such as shown in FIG. 5.

From the foregoing it is thus to be appreciated that the disclosed concept provides a robust means for isolating the sensitive wiring which is directly connected to electrical components from external forces and stresses which may be encountered during installation and use.

While specific embodiments of the disclosed concept have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the disclosed concept which is to be given the full breadth of the claims appended and any and all equivalents thereof.

What is claimed is:

1. A wire terminating post formed from a conductive material, the post comprising:
   a first end structured to interlock with a portion of an electrical component; and
   a second end disposed opposite the first end, the second end comprising:
      a first aperture defined therethrough, the first aperture having a first diameter, and
      a second aperture defined therethrough, the second aperture have a second diameter less than the first diameter.

2. The wire terminating post of claim 1, further comprising:
   a longitudinal axis extending between the first end and the second end;
   a first inward extending notch portion disposed between the first end and the second end; and
   a second inward extending notch portion disposed generally opposite the first inward extending notch portion about the longitudinal axis between the first end and the second end.

3. The wire terminating post of claim 2, wherein the first inward extending notch portion and the second inward extending notch portion are of generally semicircular shape.

4. The wire terminating post of claim 1, further comprising a longitudinal axis extending between the first end and the second end, wherein the first aperture is disposed further from the longitudinal axis than the second aperture.

5. The wire terminating post of claim 1, further comprising a longitudinal axis extending between the first end and the second end, wherein the first end includes a structure which provides for the wire terminating post to be readily insertable into a portion of an electrical component but then generally locked thereto, once inserted.

6. The wire terminating post of claim 5, wherein the structure comprises:
   an angled portion which extends from a leading edge of the first end toward the second end and away from the longitudinal axis; and
   a locking notch having a locking portion which is disposed adjacent the angled portion and extends inward toward, and is oriented generally perpendicular to, the longitudinal axis, wherein the locking portion is structured to engage a corresponding portion of the electrical component in a manner which resists removal of the terminating post from the electrical component when the wire terminating post is engaged with the electrical component.

7. A wiring arrangement comprising:
   a wire terminating post as recited in claim 1; and
   a first wire comprising:
      a first portion disposed in, without being coupled to, the first aperture, and
      a second portion disposed in, and coupled to, the second aperture.

8. The wiring arrangement claim 7, wherein the first wire comprises a conductive core surrounded by an insulating jacket, wherein the conductive core in the first portion of the first wire is spaced from the periphery of the first aperture by the insulating jacket, and wherein the conductive core in the second portion of the first wire is electrically connected to the periphery of the second aperture.

9. The wiring arrangement of claim 8, wherein the conductive core in the second portion of the first wire is coupled to the periphery of the second aperture by a solder material.

10. The wiring arrangement of claim 7, wherein the wire terminating post further comprises:
a longitudinal axis extending between the first end and the second end;
a first inward extending notch portion disposed between the first end and the second end;
a second inward extending notch portion disposed generally opposite the first inward extending notch portion about the longitudinal axis between the first end and the second end; and
a second wire wound around the wire terminating post between the first end and the second end, the second wire having at least a first portion disposed in the first inward extending notch portion and a second portion disposed in the second inward extending notch portion.

11. The wiring arrangement of claim 10, wherein the second wire is wound around the wire terminating post at least one complete revolution such that the second wire further includes a third portion also disposed in one of the first inward extending notch or the second inward extending notch.

12. The wiring arrangement of claim 10, wherein the first wire has a first gauge, wherein the second wire has a second gauge, and wherein the second gauge is greater than the first gauge.

13. An electrical device comprising:
a wiring arrangement as recited in claim 12; and
an electrical component electrically connected to the second wire.

14. The electrical device of claim 13, wherein the electrical component comprises one of a current sensor or a solenoid.

15. A method of forming the wiring arrangement of claim 7, the method comprising:
passing the first wire in a first direction through the first aperture;
positioning the first wire in the second aperture by moving the first wire in a second direction opposite the first direction; and
coupling the first wire to the periphery of the second aperture.

16. The method of claim 15, wherein coupling the first wire to the periphery of the second aperture comprises soldering the first wire to the periphery of the second aperture.

17. A method of forming the wiring arrangement of claim 7, the method comprising:
positioning the first wire in the second aperture by moving the first wire in a second direction;
coupling the first wire to the periphery of the second aperture; and
passing the first wire through the first aperture.

18. The method of claim 17, wherein coupling the first wire to the periphery of the second aperture comprises soldering the first wire to the periphery of the second aperture.

* * * * *